(12) United States Patent
Feiz Zarrin Ghalam et al.

(10) Patent No.: US 11,528,015 B2
(45) Date of Patent: Dec. 13, 2022

(54) LEVEL SHIFTER WITH REDUCED DUTY CYCLE VARIATION

(71) Applicant: Micron Technology, Inc., Boise, ID (US)

(72) Inventors: Ali Feiz Zarrin Ghalam, Sunnyvale, CA (US); Luigi Pilolli, L'Aquila (IT); Myung Gyoo Won, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/161,546

(22) Filed: Jan. 28, 2021

(65) Prior Publication Data

US 2021/0152160 A1 May 20, 2021

Related U.S. Application Data

(63) Continuation of application No. 16/392,352, filed on Apr. 23, 2019, now Pat. No. 10,911,033.

(51) Int. Cl.
*H03K 3/017* (2006.01)
*H03K 19/0185* (2006.01)
*H03K 3/356* (2006.01)

(52) U.S. Cl.
CPC ....... *H03K 3/017* (2013.01); *H03K 3/356113* (2013.01); *H03K 19/018521* (2013.01)

(58) Field of Classification Search
CPC .......... H03K 3/01; H03K 3/017; H03K 3/356; H03K 3/356104; H03K 3/356139; H03K 3/35613; H03K 3/356121; H03K 3/356113; H03K 19/0185; H03K 19/018507; H03K 19/018514; H03K 19/018521; H03K 19/018528
See application file for complete search history.

(56) References Cited

U.S. PATENT DOCUMENTS

| | | | |
|---|---|---|---|
| 4,682,047 A | 7/1987 | von Sichart | |
| 6,605,963 B2 * | 8/2003 | Kitamoto | H03K 17/102 326/62 |
| 6,741,106 B2 | 5/2004 | Humphrey | |
| 8,427,223 B2 * | 4/2013 | Kumar | H03K 3/356113 327/333 |
| 10,911,033 B2 | 2/2021 | Feiz Zarrin et al. | |
| 2017/0237428 A1 | 8/2017 | Xu et al. | |
| 2020/0343880 A1 | 10/2020 | Feiz Zarrin et al. | |

\* cited by examiner

*Primary Examiner* — Diana J. Cheng
(74) *Attorney, Agent, or Firm* — Greenberg Traurig

(57) ABSTRACT

Disclosed are level shifters and methods of performing level shifting. In one embodiment, a level shifter is disclosed comprising an input, cross-coupled/latch circuitry, a first reference node, a second reference node, and output circuitry coupled between the cross-coupled/latch circuitry and an output, wherein the output circuitry sets the output signal to high based on rising edge of a second reference node and sets the output signal to low based on the rising edge of the first reference node. Further, in some implementations, the first reference node and the second reference node may have signals that are inverse to each other.

12 Claims, 10 Drawing Sheets

US 11,528,015 B2

LEVEL SHIFTER WITH REDUCED DUTY CYCLE VARIATION

RELATED APPLICATION

The present application is a continuation application of U.S. patent application Ser. No. 16/392,352, filed Apr. 23, 2019, issued as U.S. Pat. No. 10,911,033 on Feb. 2, 2021, and entitled "LEVEL SHIFTER WITH REDUCED DUTY CYCLE VARIATION," the disclosure of which application is hereby incorporated by reference herein in its entirety.

TECHNICAL FIELD

The present disclosure relates generally to systems and methods for shifting voltage levels, and more particularly, to improvements in level shifters and related methods that provide a more stable duty cycle.

BACKGROUND

Level shifters are commonly used in semiconductor circuits to convert signal levels in one voltage domain to different voltage levels in another domain. Existing circuits for performing level shifting typically seeks to provide an output at the desired voltage level having characteristics that match those of the input signal. However, such circuits typically provide an output signal with a duty cycle that has substantial distortion or variation. They are unable to create an output signal having a stable duty cycle, e.g., free from substantial distortion such as across PVT (process voltage temperature) variation.

Various existing level shifters seek to provide stable outputs including attempts to improve duty cycle variation. However, these approaches often utilize more gates than needed, have different rising/falling delay such as may result from uneven or imbalanced gates in the rise and fall circuitry, and/or otherwise trigger the output based on internal reference signals that are poorly aligned in the time domain.

The disclosed embodiments improve duty cycle, such as by reducing distortion across PVT variation, and/or remedy these and other deficiencies of existing semiconductor circuits.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

The following disclosure describes various embodiments of improved level shifters and methods for improved operation of level shifting. In one embodiment, a level shifter is disclosed comprising an input, cross-coupled/latch circuitry, a first reference node, a second reference node, and output circuitry coupled between the cross-coupled/latch circuitry and an output, wherein the output circuitry sets the output signal to high based on rising edge of a second reference node and sets the output signal to low based on the rising edge of the first reference node. Further, the first reference node and the second reference node are symmetric nodes having signals that are inverse to each other. Such devices and methods provide for level shifters and level shifting having, inter alia, improved duty cycle, including reduced fluctuation of duty cycle, even across PVT variation.

Figure 1A:
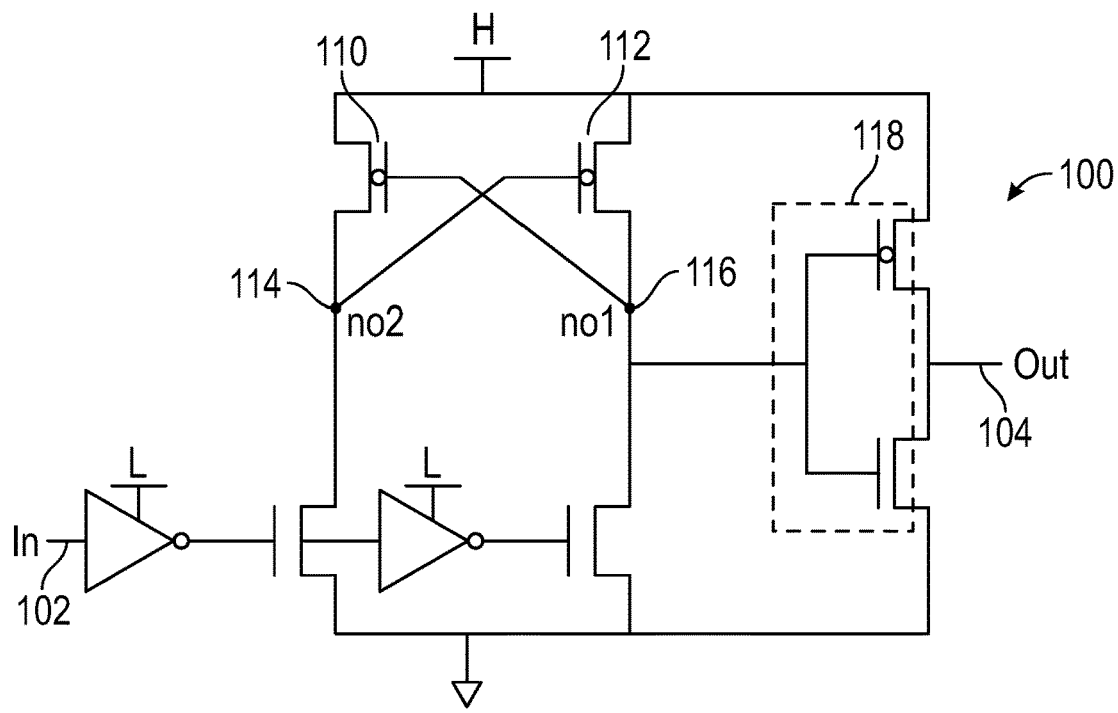
FIG. 1A is a block diagram of a level shifter known in the art.

FIG. 1A is a block diagram of a level shifter known in the art. FIG. 1A illustrates a conventional level shifter 100 having an input 102, an output 104, a cross-coupled pair of transistors 110, 112 and a transistor pair 118 at the output 104. Such conventional level shifter 100 is also characterized by a first node 116 and a second node 114 having signals that help understand the performance and limitations of such circuitry. During operation of such conventional level shifter 100, an input signal of a first voltage is first inverted and applied to a first transistor 106 coupled to the second node 114, while also being inverted again and applied to a second transistor 108 coupled to the first node 116. Here, as this signal transitions to high, the first transistor 106 is turned on, and the second transistor 108 is turned off. When transistor 106 is on, the voltage on the second node 114 is pulled low, causing a first transistor 112 of the cross-coupled pair to turn on. Similarly, when transistor 108 is off, the first node 116 is high, which causes the second transistor 110 to turn off. As a result of such establish circuit operation, a signal corresponding to the input though at a different voltage level (here, H) is provided on the first node 116. The signal on the first node 116 is then supplied to the transistor pair 118 to invert it to a polarity matching that of the input signal 102.

Figure 1B:
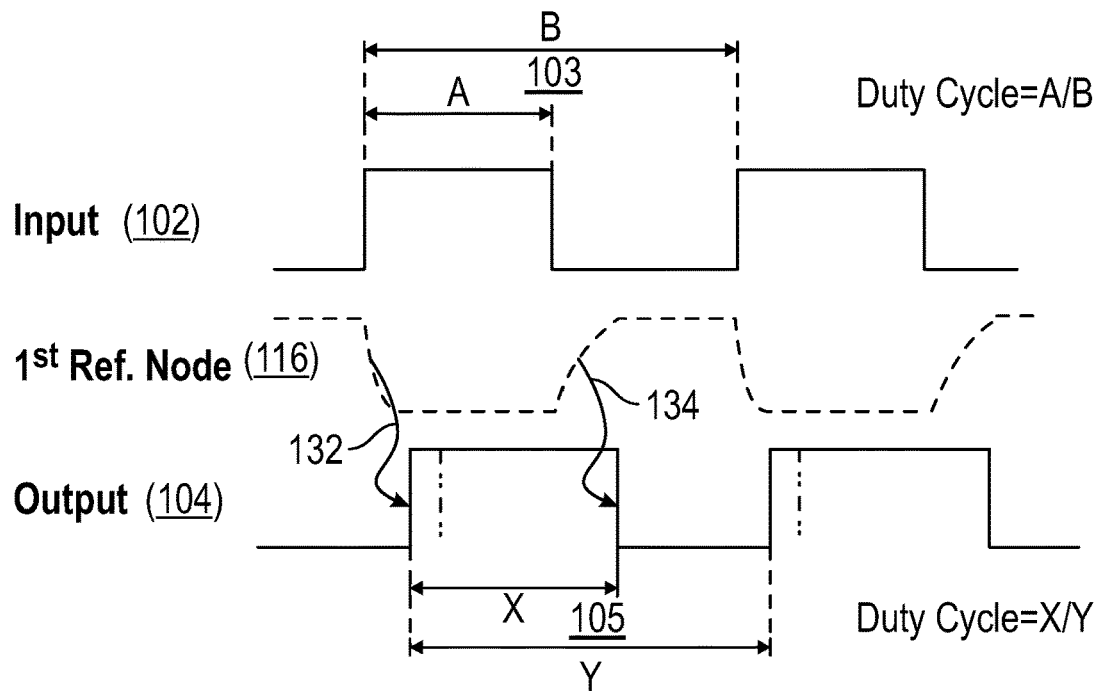
FIG. 1B is a timing diagram illustrating voltage and delay characteristics of the input, output and an intermediate node of the known level shifter of FIG. 1A.

FIG. 1B is a timing diagram illustrating voltage and delay characteristics of the input, output and an intermediate node of the known level shifter of FIG. 1A. Turning to FIG. 1B, waveforms corresponding to the input signal 102, the output signal 104, and the first node 116 of the convention level shifter 100 are shown. In such conventional level shifters, the output signal 104 transitions between high and low based on the signal on the first node 116. The duty cycle 103 of the input 102 is the ratio of time, A, that the input signal is high over one cycle or period, B. With regard to duty cycle 105 of the output 104, the time it takes the output signal 104 to transition from low to high corresponds to a first delay 132 associated with transition of the first node 116 from high to low. Similarly, the time it takes the output signal 104 to transition from high to low corresponds to a second delay 134 associated with transition of the first node 116 from low to high. Notably, the times for these 2 transitions can differ substantially, which can lead to an undesired duty cycle and/or undesired variation in duty cycle 105 of the output 104, such as the lengthier duty cycle of ~60-65%, versus the 50% duty cycle 103 of the input 102, as seen in FIG. 1B.

Figure 2:
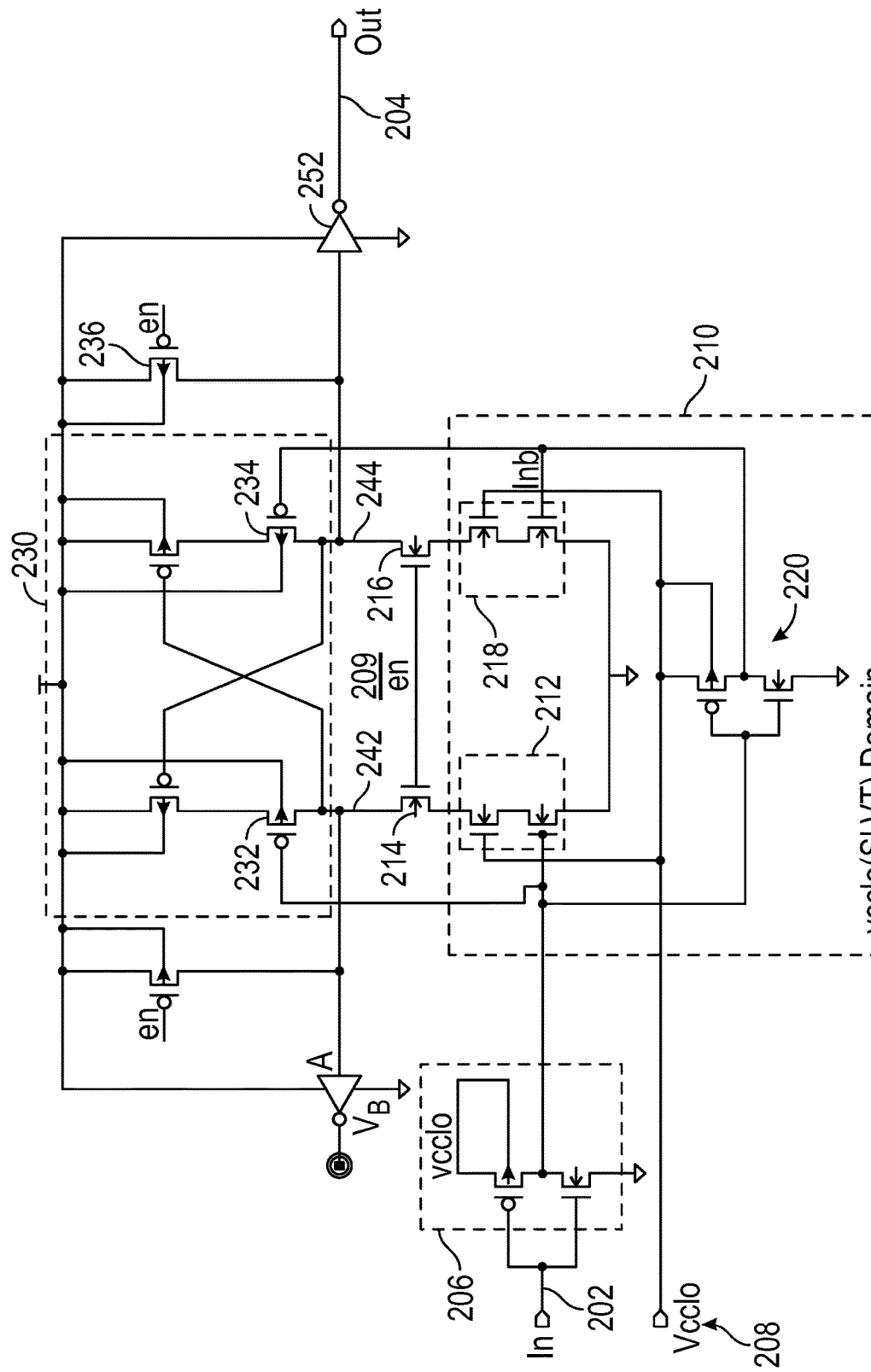
FIG. 2 is a circuit diagram of a level shifter known in the art.

FIG. 2 is a circuit diagram of an up level shifter known in the art. FIG. 2 illustrates a known up level shifter 200 with symmetric nodes, having an input 202, an output 204, a first inverter circuit 206, input circuitry 210, latch circuitry 230, and a second inverter circuit 252. The known up level shifter of FIG. 2 is largely similar in operation to the conventional level shifter of FIGS. 1A and 1B. The inverter circuits 206, 252 serve to invert their corresponding signals to the levels desired for circuit operation or output. The input circuitry has transistor pairs 212, 218 that turn on and off corresponding sides of cross-coupled transistors. This up level shifter further includes a transistor pair 220 coupled to a low voltage 208 and serving to provide an inverted signal to the latch circuitry 230, as well as 2 additional transistors 232, 234 in the latch circuitry. Further, an enable signal 209 is provided to transistors 214, 216, 236 to enable operation of the level shifting. Overall, the up level shifter 200 of FIG. 2 suffers from similar drawbacks as the level shifters of FIGS. 1A-1B, such as undesired variation in duty cycle stemming from the different delays resulting from use of both the rising edge and the falling edge of one node to trigger output.

Figure 3:
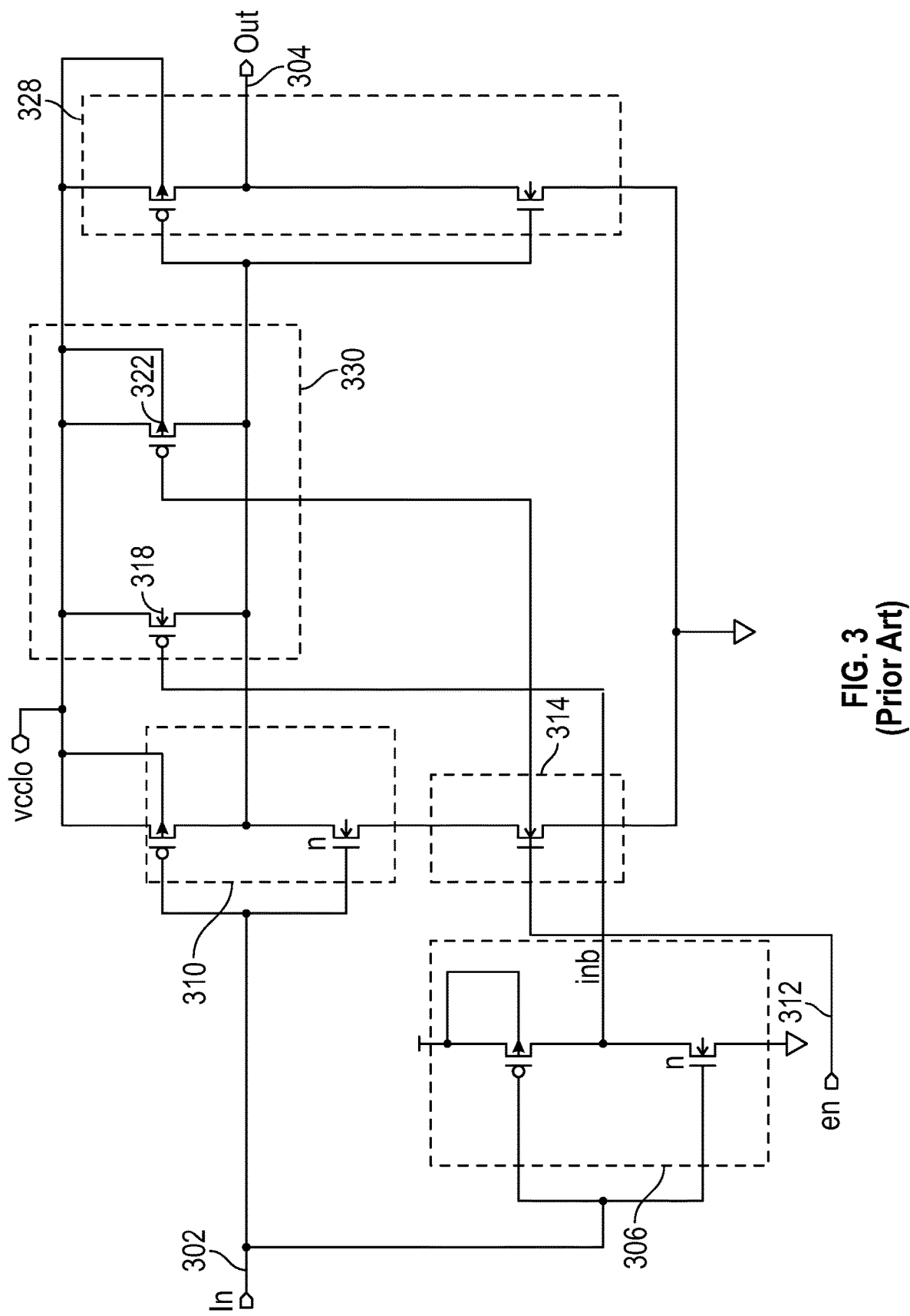
FIG. 3 is a circuit diagram of another level shifter known in the art.

FIG. 3 is a circuit diagram of a down level shifter known in the art. FIG. 3 illustrates a known down level shifter 300 having an input 302, an output 304, inverter circuits 306, 310, 328, latch circuitry 330, as well as an enable circuit 314 coupled to an enable input 312. The known down level shifter of FIG. 3 operates similarly to the level shifters of FIGS. 1A-2. The inverter circuits 306, 310, 328 serve to invert their corresponding signals to the polarity desired for circuit operation or output. The enable circuit 314 includes a transistor that enables operation. The latch circuitry 330 differs in that it includes a first transistor 318 with a gate connected to the output of the first inverter circuit 306, a second transistor 322 with a gate connected to the enable circuit 314, with both the first and second transistors having a terminal connected to the output of a second inverter circuit 310. As with the level shifters of FIGS. 1A-2, the down level shifter 300 of FIG. 3 also suffers the drawbacks of undesired variation in duty cycle stemming from the different delays resulting from use of both the rising edge and the falling edge of a signal from one node to trigger output.

Figure 4A:
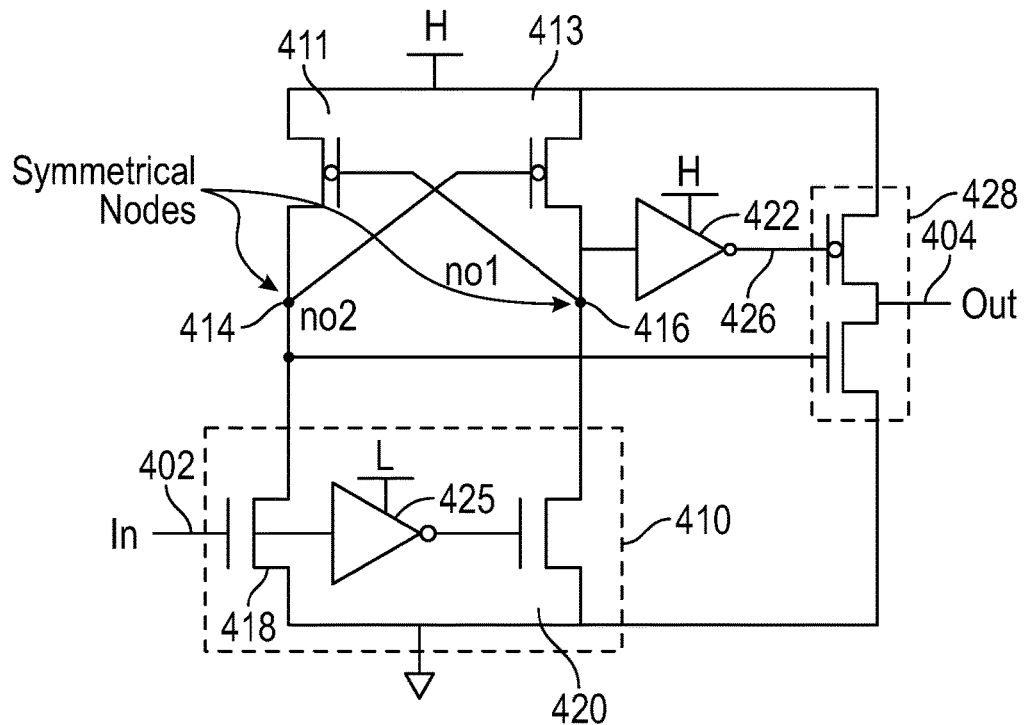
FIG. 4A is a high-level block diagram of a level shifter according to some embodiments of the disclosure.

FIG. 4A is a high-level block diagram of a level shifter according to some embodiments of the disclosure. As illustrated, the level shifter 400 includes an input 402, an output 404, latch circuitry defined by a first transistor 411, a second transistor 413, a first reference node 416 and a second reference node 414, a third transistor 418, a fourth transistor 430, a first inverter circuit 424, a second inverter circuit 422, and a transistor pair 428 at the output 404. The third transistor, the first inverter 424, and the fourth transistor 420 are designed to provide complementary signals to first and second legs of the cross-coupled transistors 411, 413 to turn them on and off, respectively, as described above.

With regard to operation, the output of the second reference node 414 and an inverse 426 of the output of the first reference node 416, i.e. inverted at 422, are provided to the inputs of transistor pair 428. The transistor pair 428 can be a pair of coupled transistors electrically-connected to the first reference node 416 and the second reference node 414, respectively, which set the output 404 to high when the voltage on the first reference node 416 transitions to high and sets the output to low when the voltage on the second reference node 414 transitions to low. Further, the first reference node 416 and the second reference node 414 are designed as symmetrical nodes. As such, the output 404 of the level shifter 400 of FIG. 4A is triggered to transition to high on the rising edge of the signal on the second reference node and triggered to transition to low on the rising edge of the (symmetrical) signal on the first reference node, as set forth in more detail below in connection with FIGS. 4B and 4C.

Figure 4B:
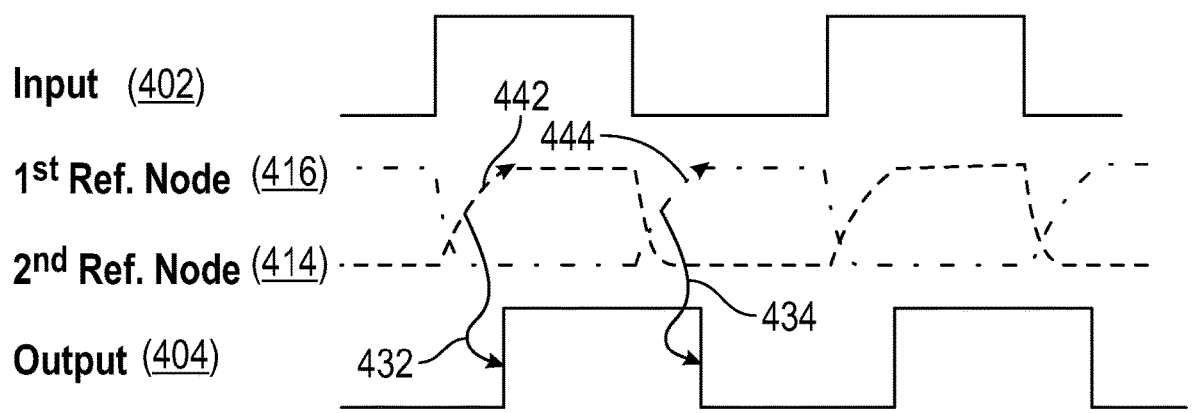
FIG. 4B is a high-level timing diagram associated with the level shifter of FIG. 4A according to some embodiments of the disclosure.

FIG. 4B is a high-level timing diagram associated with the level shifter of FIG. 4A according to some embodiments of the disclosure. Waveforms of the input 402, the output 404, the first reference node 416 and the second reference node 414 are shown. Operation of the level shifter 400 of FIG. 4A is seen, including transition of the output 404 to high, at 432, based on a rising edge 442 of the signal on the second reference node 414 as well as transition of the output 404 to low, at 434, based on a rising edge 444 of the signal on the first reference node 416.

Figure 4C:
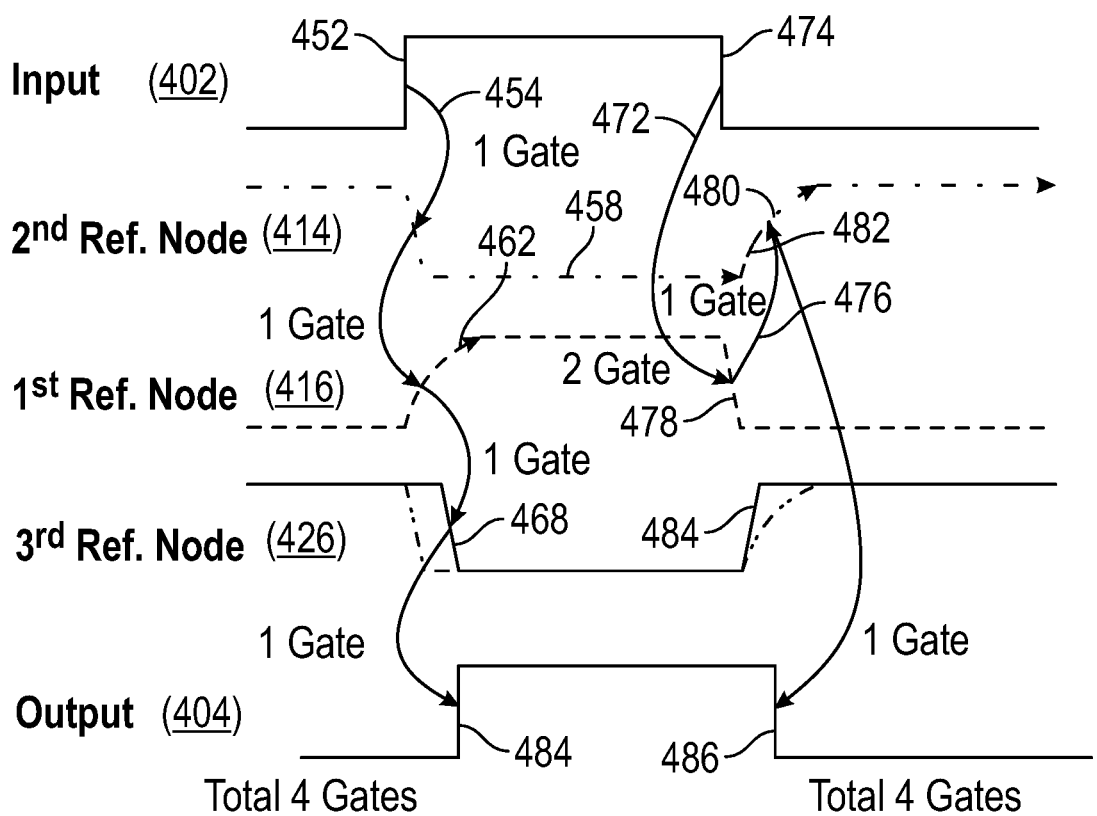
FIG. 4C is a detailed timing diagram associated with the level shifter of FIG. 4A according to some embodiments of the disclosure.

FIG. 4C illustrates a more-detailed timing diagram associated with the level shifter 400 of FIG. 4A according to some embodiments of the disclosure. Starting from the top, FIG. 4C illustrates how a high 452 at the input 402 (which turns on the third transistor 418) has the effect, at 454, of the second reference node 414 transitioning to low. Here, the second reference node 414 sits a 1-gate delay from the input. As a function of the cross-coupled pair 411, 413, transition of the second reference node 414 to low causes the first reference node 416 to transition high, at 462. Here, the first reference node 416 has a 2-gate delay from the input. Further, as a function of the second inverter circuit 422, a low on the first reference node 416 provides a high on the third reference node 426. Here, the third reference node 426 has a 3-gate delay from the input. Lastly, the final output signal 404 will transition high 484 as a function of the signal on the third reference node 426 via operation of the transistor pair 428. Here, such output 404 has a total of a 4-gate delay from the input. Accordingly, the output 404 is triggered high based on the rising edge of the first reference node (2-gate delay) as further delayed through 2 additional transistor stages (yielding a 4-gate delay, in total).

Referring to the falling signal (right side) of FIG. 4C, transition of the output 404 from high to low, at 486, is triggered based on transition of the signal on the second reference node 414 from low to high, at 482. In the disclosed technology, circuit components and parameters of innovative level shifters 400 herein are selected to provide that the voltages on the first reference node 416 and the second reference node 414 are symmetrical, though inverse, of each other. As such, the second reference node 414 transitions from low to high, at 482, in symmetry with the first reference node 416 transitioning from high to low, at 478. Here, the signal transitioning from high to low, at 478, on the first reference node 416 has a 2-gate delay from the input, as explained above. A corresponding transition of the second reference node 414 from low to high, at 482, occurs in a symmetrical manner with such transition of the first reference node 416 from high to low, at 478. Here, transition of the second reference node is triggered via a change in the symmetrical first reference node and its change-in-state is completed as a function of the speed that the first transistor 411 of the cross-coupled pair transitions off, such that the signal transition from low to high, at 482, has a 3-gate delay. The second reference node 414 is then provided as an input to the transistor pair 428 at output, and thereby used to transition the output signal 404 from high to low as a function of the speed that the second reference signal 414 transitions to high based on such circuit operation. Here, then, as soon as the second reference node 414 rises sufficiently to high, at 480, the output 404 will transition to low as a function of such rise of the second reference node 414. This output 404 transitioning from high to low, at 486, has a 4-gate delay from the input. The ability of the output 404 to transition both to high and to low via paths having 4-gate stage counts, provides for greater alignment of the rise and fall of the output signal 404 with the input signal 402 in the time domain, including reduced distortion and improvement of associated parameters such as duty cycle. Additionally, the triggering of the output 404 as a function of only the rising edges of each symmetrical node 416, 414 further reduces variation of the duty cycle and provides added stability. Moreover, in some aspects, the transition to low at the output 404 as a function of the signal on the second reference node 414 may occur sooner as a function of the second reference node 414 transitioning to high more quickly based on speed that the first reference node and third reference node 426 transition to steady state and draw the output 404 to low.

Figure 5A:
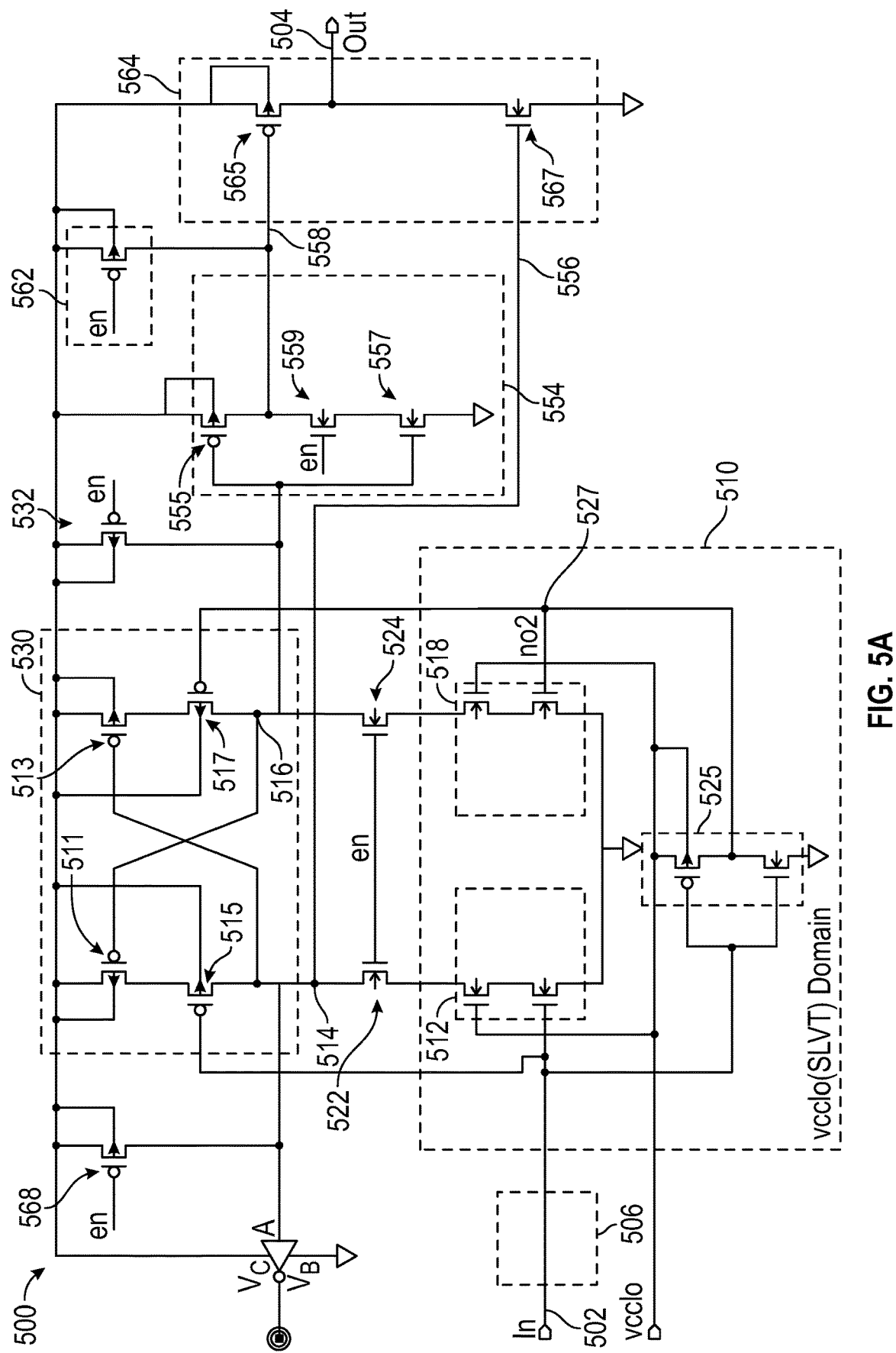
FIG. 5A is a circuit diagram of a level shifter according to some embodiments of the disclosure.

FIG. 5A is a circuit diagram of an illustrative up level shifter 500 according to some embodiments of the disclosure. The up level shifter 500 includes an input 502, an output 504, cross-coupled/latch circuitry 530, a first reference node 516, a second reference node 514, input circuitry 510, enable circuitry 522, 524, 532, 562, inverter circuitry 554, and an output circuit 564. The input circuitry can include an inverter circuit 525 such as a transistor pair coupled between the input 502 and a node 527, a first transistor pair 512 coupled to the input 502 and a second transistor pair 518 coupled between the first transistor pair 512 and the node 527. The cross-coupled/latch circuitry 530 in the embodiment shown can include a first transistor 511 and a second transistor 513, with the first transistor 511 and the second transistor 513 being cross-coupled. In some aspects, the cross-coupled/latch circuitry 530 can further include a third transistor 515 coupled between the first transistor 511 and the input/input circuitry 510 as well as a fourth transistor 517 coupled between the second transistor and the input circuitry 510, such as to the output of the inverter circuit 525. The output circuit 564 may comprise a transistor pair 565, 567 with a first transistor 565 coupled to the first reference node 516 (e.g., via an inverter circuit 554), and a second transistor 567 coupled to the second reference node 514. The inverter circuit 554 can include a transistor pair 555, 557 and may also include a third transistor 559 coupled to an enable signal. Enable signal(s) may also be provided to a circuit 532 that enables input to the inverter circuit 554 via the first reference node 516, to a circuit 562 that enables the third reference node 558, to one or more transistors 522, 524 that enable branches of the cross-coupled/latch circuit 530, and/or to another circuit 568 that enables operation of the cross-coupled pair 511, 513. As noted above, the output of the inverter circuit 525 is coupled to a node 527 which may be coupled to one or both of the cross-coupled/latch circuitry 530 and/or the second transistor pair 518. With regard to the up level shifter 500 of FIG. 5A, it is noted, at 506, that this circuit arrangement does not include or require an inverter directly at input, as seen in embodiments of the prior art. As such, the up level shifter 500 can reduce the gate delay seen on many of the internal reference nodes as well as the total gate delay of the entire circuit, at output. Among other things, this can reduce transistor count and associated power consumption, increase operating speed, and/or reduce variation in duty cycle.

Figure 5B:
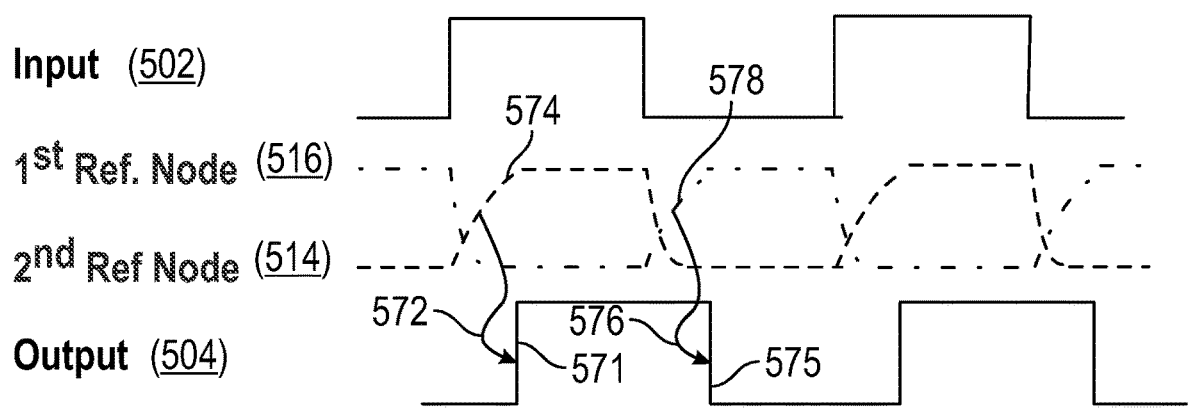
FIG. 5B is a timing diagram associated with the level shifter of FIG. 5A according to some embodiments of the disclosure.

FIG. 5B is a timing diagram associated with the up level shifter 500 of FIG. 5A according to some embodiments of the disclosure. Waveforms of the input 502, the output 504, the first reference node 516 and the second reference node 514 are shown. Operation of the up level shifter 500 of FIG. 5A is seen, including transition of the output 504 to high, at 571, based on a rising edge 574 of the signal on the second reference node 514 as well as transition of the output 504 to low, at 575, based on a rising edge 578 of the signal on the first reference node 516. Such transition of the output signal 504 from low-to-high and from high-to-low based on these rising edges is illustrated, respectively, at 572 and 576, in FIG. 5B.

Figure 6:
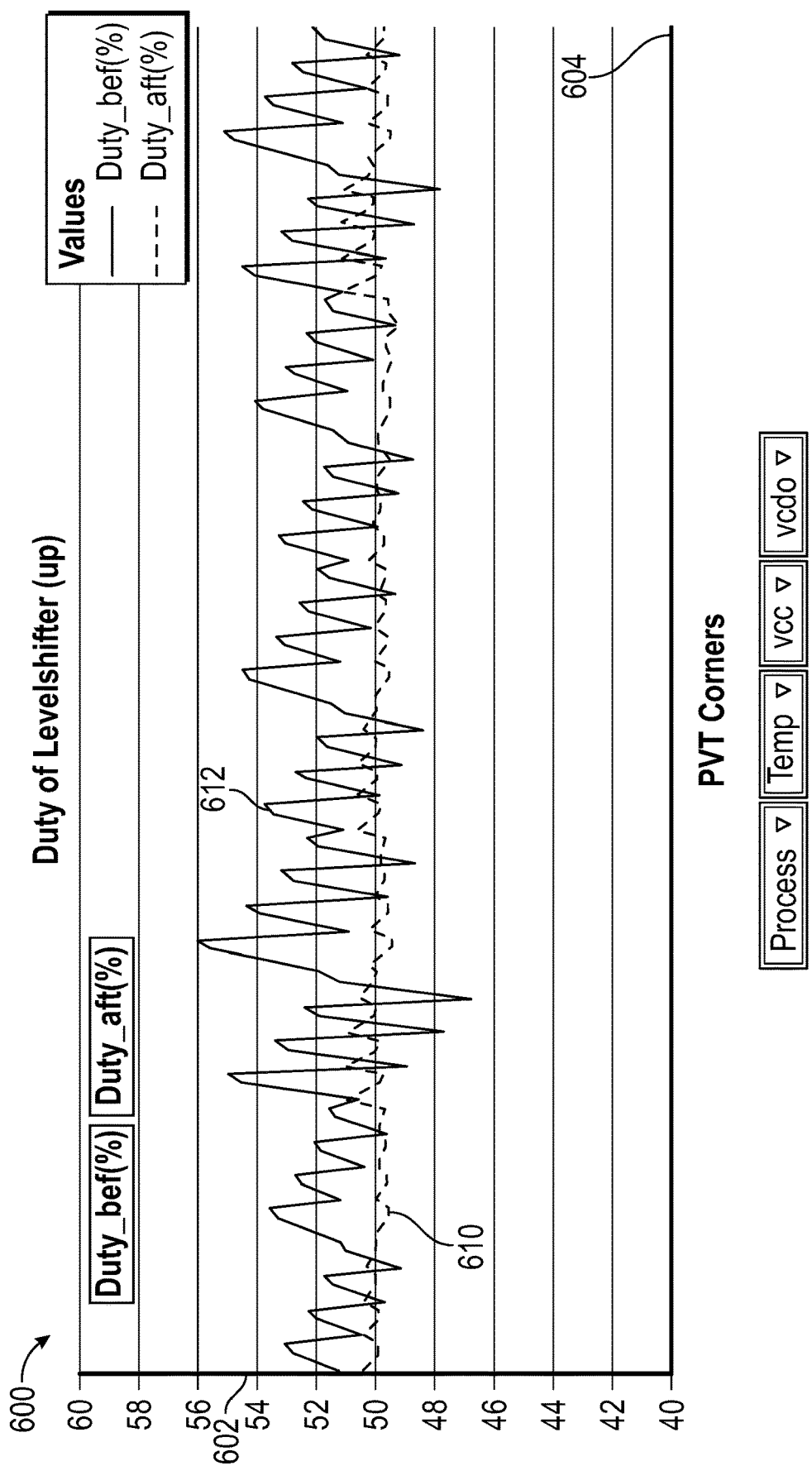
FIG. 6 is a graph illustrating a comparison of duty cycle between a level shifter consistent with the disclosed technology and a known level shifter according to some embodiments of the disclosure.

FIG. 6 is a graph 600 illustrating a comparison of duty cycle between a known up level shifter (e.g., FIG. 2) and an up level shifter consistent with the disclosed technology, such as one described in FIGS. 5A-5B, according to some embodiments of the disclosure. Referring to FIG. 6, a graph of variations in duty cycle 602 of a known up level shifter, at 612, as compared against a graph of the difference in duty cycle of the up level shifter of FIGS. 5A-5B, at 610, are shown in regard to PVT (process, voltage, temperature) corners along the time axis 604. As illustrated, the duty cycle of the prior art 612 fluctuates greatly over the time period shown, varying from 56% down to 47% of the ideal 50% duty cycle value. In contrast, the duty cycle of the disclosed innovations 610 is much more closely in line with the ideal value of 50%. Here, in this illustrative example, the innovative duty cycle varies from only 51% down to about 49.5%, and overall fluctuation also occurs much less frequently, with many values of duty cycle being right at the ideal 50% mark.

Figure 7:
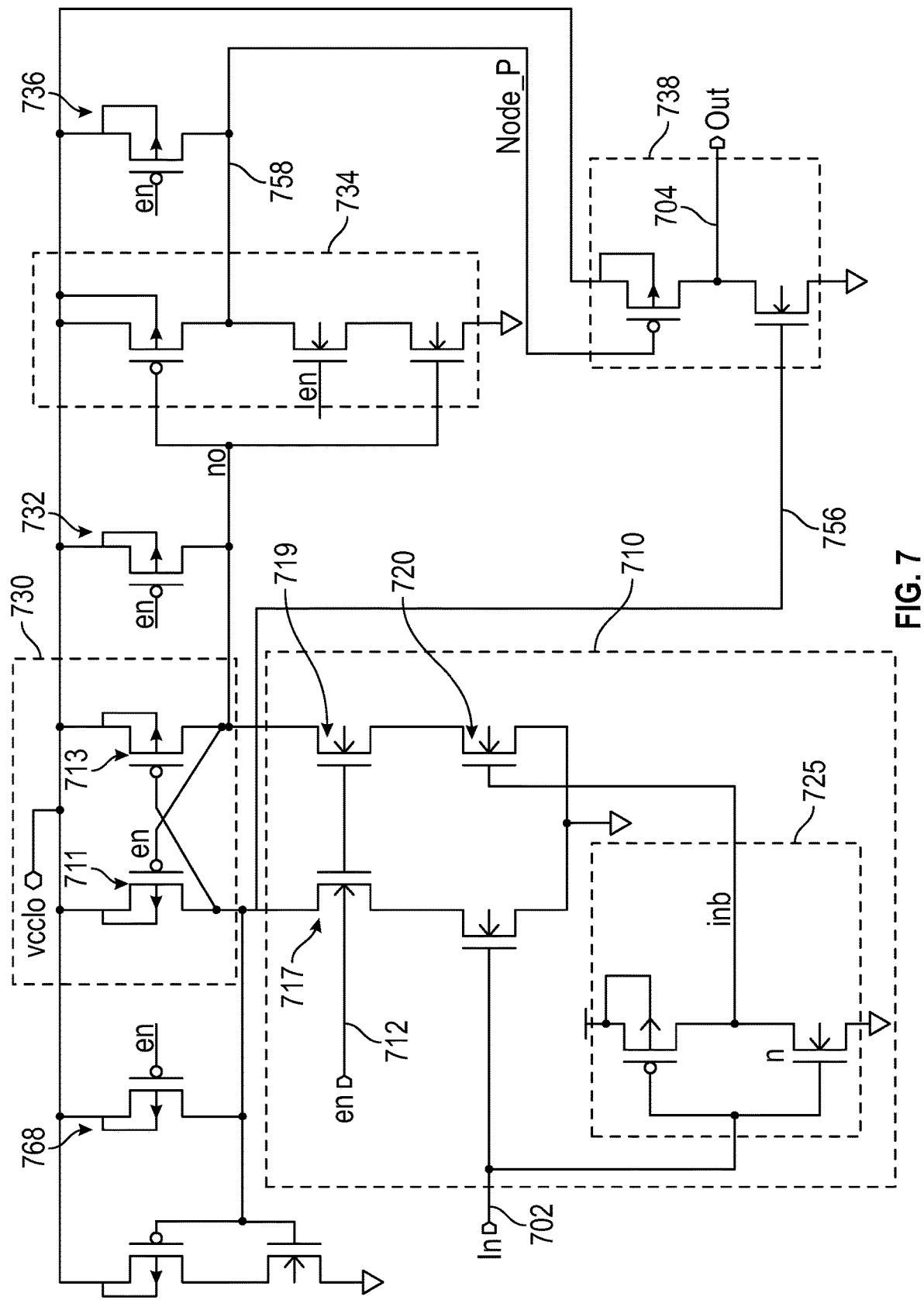
FIG. 7 is a circuit diagram of another level shifter according to some embodiments of the disclosure.

FIG. 7 is a circuit diagram of an illustrative down level shifter 700 according to some embodiments of the disclosure. The down level shifter 700 includes an input 702, an output 704, cross-coupled/latch circuitry 730, a first reference node 716, a second reference node 714, input circuitry 710, enable circuitry 732, 736, 768, 717, 719, inverter circuitry 734, and an output circuit 738. The input circuitry can include an inverter circuit 725 such as a transistor pair coupled between the input 702 and another transistor 720, a first transistor pair 712 coupled to the input 702 and a second transistor pair 718 coupled between the first transistor pair 712 and the cross-coupled/latch circuitry 730. The cross-coupled/latch circuitry 730 in the embodiment shown can include a first transistor 711 and a second transistor 713, with the first transistor 711 and the second transistor 713 being cross-coupled. The output circuit 738 may comprise a transistor pair 765, 767 with a first transistor 765 coupled to the first reference node 716 (e.g., via an inverter circuit 734), and a second transistor 767 coupled to the second reference node 714. The inverter circuit 734 can include a transistor pair 755, 757 and may also include a third transistor 759 coupled to an enable signal. Enable signal(s) may also be provided to a circuit 732 that enables input to the inverter circuit 734 via the first reference node 716, to a circuit 736 that enables the third reference node 758, to one or more transistors 717, 719 that enable operation of the input circuitry 710 and/or the cross-coupled/latch circuit 730, and/or to another circuit 768 that enables operation of the cross-coupled pair 711, 713. The down level shifter 700 of FIG. 7 is similar to the up level shifter 500 of FIG. 5A in that this circuit arrangement does not include or require an inverter directly at input, as seen in embodiments of the prior art. As such, the down level shifter 700 can reduce the gate delay seen on many of the internal reference nodes as well as the total gate delay of the entire circuit at output. Among other things, this can reduce transistor count and associated power consumption, increase operating speed, and/or reduce variation in duty cycle.

Figure 8:
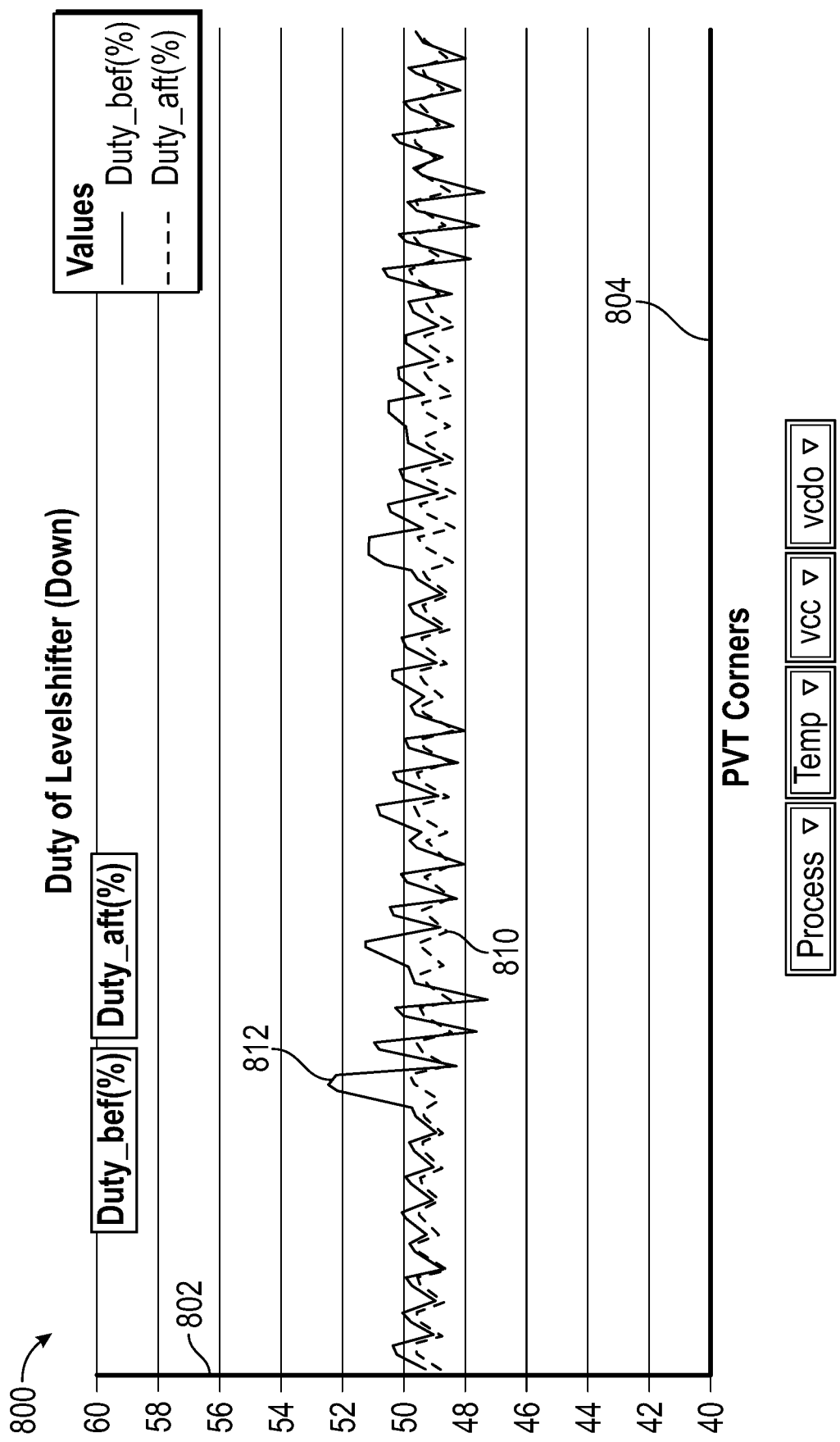
FIG. 8 is a graph illustrating a comparison of duty cycle between a level shifter consistent with the disclosed technology and a known level shifter according to some embodiments of the disclosure.

FIG. 8 is a graph 800 illustrating a comparison of duty cycle between another known down level shifter (e.g., of FIG. 3) and a down level shifter consistent with the disclosed technology, such as that of FIG. 7, according to some embodiments of the disclosure. Referring to FIG. 8, a graph of variations in duty cycle 802 of the down level shifter of FIG. 3, at 812, as compared against a graph of the difference in duty cycle of the down level shifter of FIG. 7, at 810, are shown in regard to PVT corners along the time axis 804. As illustrated, the duty cycle of the prior art 812 fluctuates significantly over the time period shown, varying from ~52.5% down to almost 47% of the ideal 50% duty cycle value. In contrast, the duty cycle of the disclosed innovations 810 is much more closely in line with the ideal value of 50%. Here, the duty cycle of the innovative down level shifter varies from ~50% down to about 48.5%, and overall fluctuation also occurs much less frequently, with many values of duty cycle being closer to the ideal 50% mark than corresponding duty cycle value from the prior art.

The subject matter disclosed above may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Those skilled in the art will recognize that the methods and devices of the present disclosure may be implemented in many manners and as such are not to be limited by the foregoing exemplary embodiments and examples. In other words, aspects/elements can be performed by single or multiple components, in various combinations and/or sub-combinations, and individual aspects, may be distributed among components and/or subcomponents. In this regard, any number of the features of the different embodiments described herein may be combined into single or multiple embodiments, and alternate embodiments having fewer than, or more than, all the features described herein are possible.

While various embodiments have been described for purposes of this disclosure, such embodiments should not be deemed to limit the teaching of this disclosure to those embodiments. Various changes and modifications may be made to the elements and features described above to obtain a result that remains within the scope of the systems and processes described in this disclosure.

The invention claimed is:

1. A level shifter device comprising:
an input node coupled to an input of the level shifter device;
cross-coupled latch circuitry coupled to the input node and including a first transistor and a second transistor that are cross-coupled;
a first reference node connected to a gate of the first transistor;
a second reference node connected to the gate of the second transistor;
a first inverter circuit with the first reference node as an input and a third reference node as an output; and
output circuitry coupled to an output of the level shifter device, the output circuitry having a first PMOS transistor with a source coupled to a high supply voltage, a drain coupled to the output of the level shifter device and a gate connected to the third reference node, and the output circuitry having a first NMOS transistor with a source coupled to a low supply voltage, a drain coupled to the output of the level shifter device and a gate connected to the second reference node.

2. The device of claim 1, wherein a rise of voltage at the output of the level shifter device is triggered as a function of a rising edge of the first reference node.

3. The device of claim 1, further comprising input circuitry coupled between the input node and the first and second reference node.

4. The device of claim 3, wherein the input circuitry includes a second inverter circuit.

5. The device of claim 3, further comprising an enable circuit coupled between the input circuitry and the first reference node to enable a voltage level at the first reference node to change in response to a voltage change at the input node.

6. The device of claim 5, wherein the enable circuit is controlled by an enable signal.

7. The device of claim 6, wherein the enable signal is coupled to the first inverter circuit for enabling the first inverter circuit.

8. The device of claim 6, further comprising a second PMOS transistor having a source coupled to the high power supply voltage, a drain coupled to the first reference node and a gate coupled to the enable signal for enabling a voltage at the first reference node to change in response to a voltage change at the input node.

9. The device of claim 6, wherein the enable circuit includes a first enable transistor coupled between the first reference node and the input circuitry and a second enable transistor coupled between the second reference node and the input circuitry, a gate of the first enable transistor and a gate of the second enable transistor being coupled to the enable signal to enable voltages at the first reference node and the second reference node to change in response to a voltage change at the input node.

10. The device of claim 3, wherein the cross-coupled latch circuitry further includes a third transistor coupled between the first transistor and the input circuitry and a fourth transistor coupled between the second transistor and the input circuitry.

11. The device of claim 1 wherein the output is set to high based on the rising edge of a signal on the first reference node at a 4-gate delay from the input, and the output is set to low based on the rising edge of a signal on the second reference node at a 4-gate delay from the input.

12. The device of claim 1 wherein the output is set to high based on the rising edge of a signal on the first reference node at first gate delay from the input, and the output is set to low based on the rising edge of a signal on the second reference node at a second gate delay from the input, wherein the first gate delay is equal to the second gate delay.

* * * * *